(12) United States Patent
Matsumoto et al.

(10) Patent No.: US 7,443,690 B2
(45) Date of Patent: Oct. 28, 2008

(54) ADAPTER DEVICE, MEMORY DEVICE AND INTEGRATED CIRCUIT CHIP

(75) Inventors: Shigeo Matsumoto, Kanagawa (JP); Yasushi Fujita, Kanagawa (JP); Katsumi Endo, Kanagawa (JP)

(73) Assignee: Sony Corporation (JP)

( * ) Notice: Subject to any disclaimer, the term of this patent is extended or adjusted under 35 U.S.C. 154(b) by 220 days.

(21) Appl. No.: 11/471,339

(22) Filed: Jun. 20, 2006

(65) Prior Publication Data

US 2006/0232946 A1   Oct. 19, 2006

Related U.S. Application Data

(63) Continuation of application No. 09/993,094, filed on Nov. 6, 2001, now Pat. No. 7,110,262.

(30) Foreign Application Priority Data

Nov. 10, 2000  (JP) ............................ P2000-344453
Mar. 27, 2001  (JP) ............................ P2001-091268

(51) Int. Cl.
  *H05K 7/14* (2006.01)
(52) U.S. Cl. .................... 361/737; 361/727; 361/756
(58) Field of Classification Search ................ 361/737, 361/727, 720, 756, 686, 741, 802; 439/377
  See application file for complete search history.

(56) References Cited

U.S. PATENT DOCUMENTS

| | | | |
|---|---|---|---|
| 5,155,663 A | 10/1992 | Harase | |
| 5,184,282 A | 2/1993 | Kaneda et al. | |
| 5,584,043 A | 12/1996 | Burkart | |
| 5,608,606 A | 3/1997 | Blaney | |
| 5,841,870 A * | 11/1998 | Fieres et al. | ................ 713/156 |
| 5,847,932 A | 12/1998 | Kantner | |
| 6,097,605 A | 8/2000 | Klatt et al. | |
| 6,203,378 B1 | 3/2001 | Shobara et al. | |
| 6,342,664 B2 * | 1/2002 | Sawada et al. | ................ 84/601 |
| 6,457,647 B1 | 10/2002 | Kurihashi et al. | |
| 6,461,170 B1 | 10/2002 | Oliphant et al. | |
| 6,665,190 B2 | 12/2003 | Clayton et al. | |
| 6,665,736 B1 | 12/2003 | Fan | |

* cited by examiner

*Primary Examiner*—Hung S Bui
(74) *Attorney, Agent, or Firm*—Lerner, David, Littenberg, Krumholz & Mentlik, LLP

(57) ABSTRACT

A memory device has a variable storage capacity depending on the object of use by a user, thereby improving convenience in use of the device. The memory device has a casing which may be loaded into host equipment. The casing has a plural number of loading sections in each of which a memory chip can be mounted. The casing carrying the memory chips has a terminal unit at the end insertable in the host equipment. Data readout from or writing into the memory chip is controlled by a semiconductor unit forming a control circuit disposed in the casing. The memory device may be of a recording capacity as desired by a user by changing the number of the memory chips mounted in the loading sections or by mounting memory chips of variable recording capacities in the loading sections.

9 Claims, 9 Drawing Sheets

ADAPTER DEVICE, MEMORY DEVICE AND INTEGRATED CIRCUIT CHIP

CROSS-REFERENCE TO RELATED APPLICATIONS

The present application is a continuation of U.S. application Ser. No. 09/993,094, filed Nov. 6, 2001, which claims priority from Japanese application Nos. 2000-344453 filed Nov. 10, 2000 and 2001-091268 filed Mar. 27, 2001, the disclosures of which are hereby incorporated by reference herein.

BACKGROUND OF THE INVENTION

This invention relates to an adapter device to or from which an integrated circuit unit, such as memory chip, can be mounted or dismounted, and which is loaded on a host equipment as the integrated circuit unit is loaded thereon, a memory device comprised of the adapter device on which the memory chip is loaded, and to an integrated circuit chip that can be mounted or dismounted to or from the adapter device.

As an external memory device for an information processing apparatus, such as a personal computer or a digital still camera, there is a substantially plate-shaped memory device employing a semiconductor memory as a recording medium. The memory device of a larger storage capacity is able to store information signals up to a higher value of approximately 64 Mbytes.

If this memory device is used as an external storage device, such as for a digital still camera, picture data having a larger data size can be manipulated. Since these numerous picture data cannot be stored in a sole memory device, the user has to purchase a new memory device.

There are occasions where music data or data processed by a computer are stored on this memory device in addition to the picture data. If many sorts of data are stored in a sole memory device, the user may forget the data stored on the memory device, with the result that data management becomes complex in order to prevent this from occurring.

Moreover, in saving digital contents protected by copyright, such as music data, in the memory device, a copyright management function needs to be provided in order to prohibit unauthorized copying of digital contents. Thus, in the memory device, it may become necessary to add a function capable of coping with different sorts of information signals to be saved.

SUMMARY OF THE INVENTION

It is therefore an object of the present invention to provide a novel adapter device in which, by mounting an integrated circuit chip having various functions on a main body unit of the adapter device and by enabling the main body unit carrying the integrated circuit chip to be mounted in host equipment, it is possible to add a variety of functions to the host equipment to improve convenience in use thereof.

It is another object of the present invention to provide a novel memory device in which a memory chip can be mounted on or dismounted from the main body unit of the device to enable the storage capacity to be varied depending on the objective of using the memory device by the user to improve convenience in use of the memory device.

It is still another object of the present invention to provide a novel memory device in which a chip with a built-in integrated circuit unit having a function distinct from the memory function can be loaded on a loading portion of the memory device to enable new functions to be added readily.

It is yet another object of the present invention to provide an integrated circuit chip having a variety of functions for a main body unit of the adapter device that can be mounted to or dismounted from the host equipment and that is aimed at annexing a variety of functions to the host device.

In one aspect, the present invention provides an integrated circuit device adapted to be loaded in host equipment, including a substantially rectangular main body unit; a first set of connection terminals provided at one end of the main body unit to enable electrical connection between the main body unit and the host equipment; a plurality of loading sections provided in the main body unit, each of the loading sections having an insertion opening along an edge of the main body unit transverse to the one end and a second set of connection terminals spaced from the insertion opening; a plurality of substantially rectangular integrated circuit chips assembled in respective ones of the loading sections, each of the integrated circuit chips including a built-in integrated circuit unit forming a memory unit or a logic circuit and a third set of connection terminals for establishing electrical connection between the second set of connection terminals in the loading section and the integrated circuit unit; a guide support provided in each of the loading sections and extending in a direction transverse to the insertion opening for guiding the insertion of the integrated circuit chips into the loading sections; and a controller disposed in the main body unit for controlling the writing of information signals to and the readout of information signals from the plurality of integrated circuit chips loaded in the loading sections.

In another aspect, the present invention provides a memory device adapted to be loaded in host equipment, including a substantially rectangular main body unit; a first set of connection terminals provided at one end of the main body unit to enable electrical connection between the main body unit and the host equipment; a plurality of loading sections provided in the main body unit, each of the loading sections having an insertion opening along an edge of the main body unit transverse to the one end and a second set of connection terminals spaced from the insertion opening; a plurality of substantially rectangular memory chips assembled in respective ones of the loading sections, each of the memory chips including a memory unit therein and a third set of connection terminals for establishing electrical connection between the second set of connection terminals in the loading section and the memory unit; a guide support provided in each of the loading sections and extending in a direction transverse to the insertion opening for guiding the insertion of the memory chips into the loading sections; and a controller disposed in the main body unit for controlling the writing of information signals to and the readout of information signals from the plurality of memory chips loaded in the loading sections.

In still another aspect, the present invention provides an adapter device adapted to be loaded in host equipment, including a substantially rectangular main body unit; a first set of connection terminals provided at one end of the main body unit to enable electrical connection between the main body unit and the host equipment; a plurality of loading sections provided in the main body unit, each of the loading sections having an insertion opening along an edge of the main body unit transverse to the one end and a second set of connection terminals spaced from the insertion opening; a plurality of substantially rectangular integrated circuit chips or dummy chips assembled in respective ones of the loading sections, each of the integrated circuit chips including a built-in integrated circuit unit forming a memory unit or a logic circuit in electrical connection with the second set of connection terminals in the loading section, each of the dummy chips being of substantially the same shape as the integrated circuit chips; a guide support provided in each of the loading sections and extending in a direction transverse to the insertion opening for guiding the insertion of the integrated circuit chips or the dummy chips into the loading sections; and a controller disposed in the main body unit for controlling the integrated circuit chips loaded in the loading sections.

In still another aspect, the present invention provides a substantially rectangular integrated circuit chip adapted to be loaded in an adapter device for use in host equipment, the integrated circuit chip including a main body unit removably insertable into and ejectable from the adapter device; an integrated circuit unit disposed in the main body unit; a set of terminals provided at one end of the main body unit for establishing an electrical connection enabling information signals to be exchanged between the integrated circuit unit and the adapter device; and a guide support unit provided on a side of the main body unit for guiding the insertion of the main body unit into the adapter device.

In yet another aspect, the present invention provides a substantially rectangular dummy chip adapted to be loaded in an adapter device for use in host equipment, including a main body unit removably insertable into and ejectable from the adapter device; and a guide support unit provided on a side of the main body unit for guiding the insertion of the main body unit into or removal of the main body unit from the adapter device.

With the adapter device of the present invention, the functions owned by the integrated circuit chip can be annexed to those of the host equipment on exchanging the integrated circuit chip mounted on the adapter device to improve the convenience in use of the host equipment.

With the memory device of the present invention, since the overall storage capacity can be set solely by exchanging the memory chips, the user is able to change the storage capacity of the memory device depending on the object of use to improve the convenience in use of the memory device. Moreover, the user is free to select the memory chip application from one loading section to another, with the result that the user is able to manage the data readily. In addition, if a further memory is required, the user only has to purchase a memory chip, and hence may be relieved of redundant economic loads.

With the integrated circuit chip according to the present invention, new functions may readily be annexed to the host equipment simply by employing a memory device, a copyright protective circuit unit, a transmission/reception circuit unit, an antenna unit or a power source unit as the integrated circuit unit disposed in the main body unit of the chip, and by mounting the adapter device carrying the integrated circuit chip in the host equipment. Moreover, by loading an integrated circuit chip having a function(s) other than the memory function to the adapter device, a variety of functions may be annexed to the memory device to enlarge the application of the memory device.

DETAILED DESCRIPTION

Figure 1:
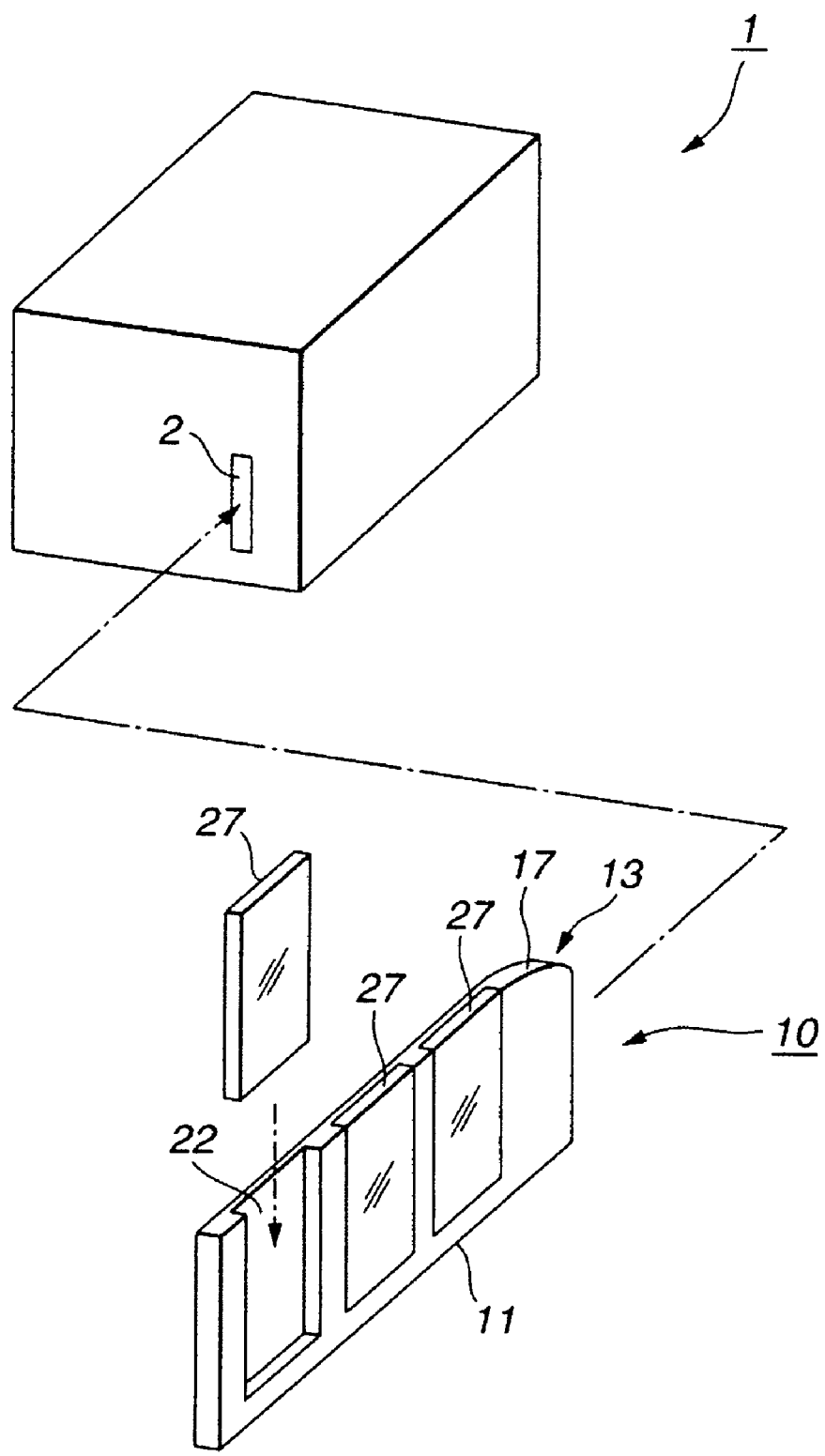
FIG. 1 illustrates the mode of using a memory device embodying the present invention.

Referring to the drawings, an adapter device, a memory device and an integrated circuit chip used as this memory device according to the present invention will be explained in detail.

Referring to FIG. 1, the memory device 10 is used as an external storage device for a host equipment 1, such as a personal computer, a digital still camera, a digital video camera or an audio equipment. In this memory device 10, information signals, such as data processed by a computer, picture data, video data or music data, are stored.

The memory device 10 is loaded on the host equipment 1 through an insertion/ejection opening 2 provided in the host equipment 1, as shown in FIG. 1, for recording and/or reproducing information signals.

Figure 2:
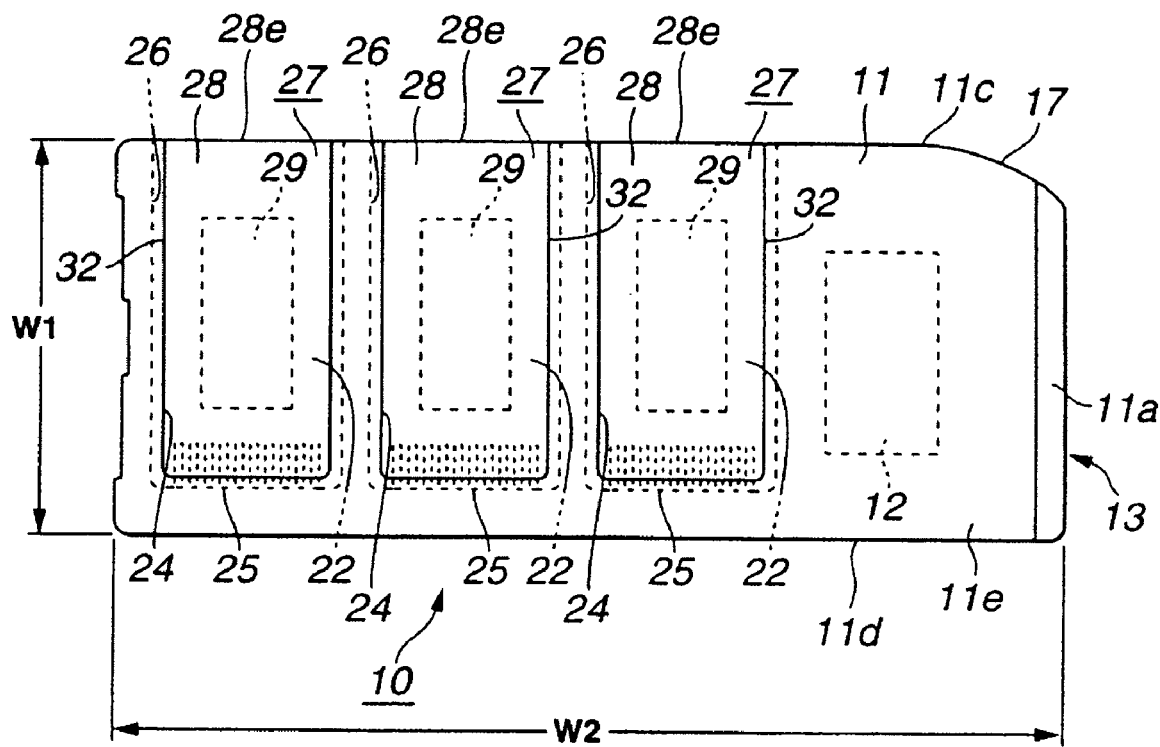
FIG. 2 is a plan view showing the memory device.
Figure 3:
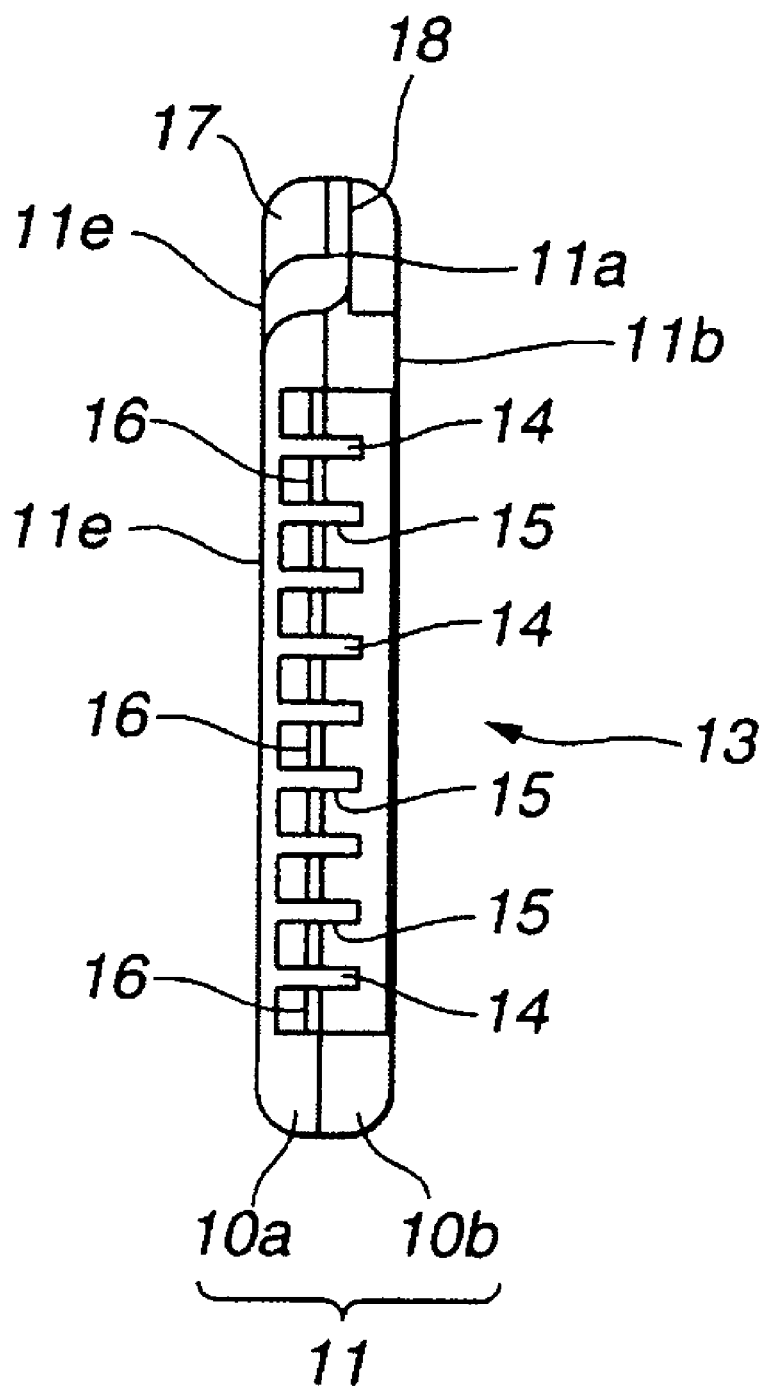
FIG. 3 is a front view thereof.
Figure 4:
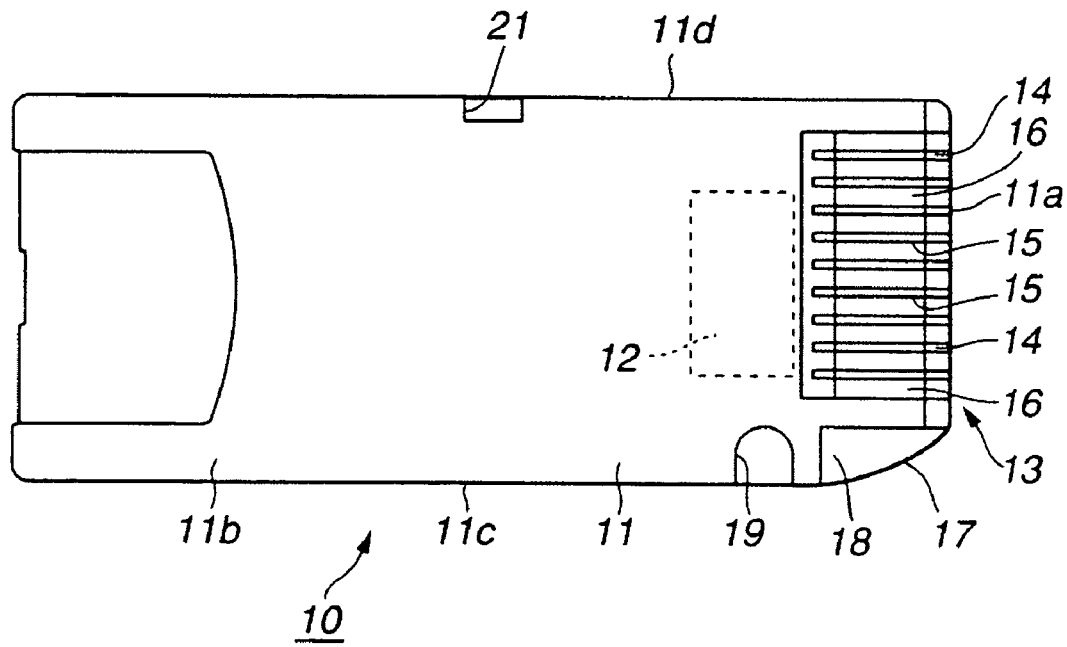
FIG. 4 is a bottom view thereof.
Figure 5:
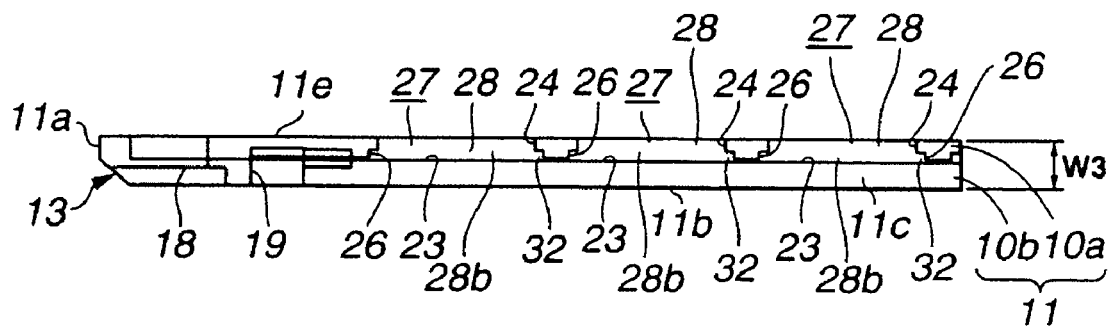
FIG. 5 is a side view thereof.

The memory device 10, used as described above, is in a substantially rectangular shape, with the length of a short side W1 being approximately 21.45 mm, the length of a long side W2 being approximately 50 mm and with the thickness W3 being 2.8 mm, as shown in FIGS. 2 and 5.

Figure 11A:
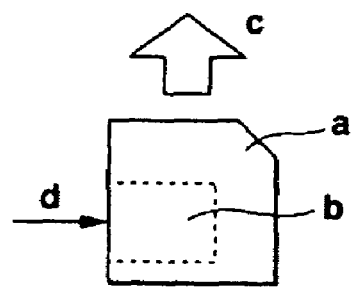
FIGS. 11A to 11D are schematic views showing the manner of insertion of several memory devices into the host equipment.
Figure 11B:
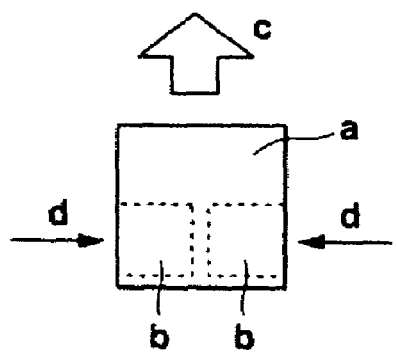
Figure 11C:
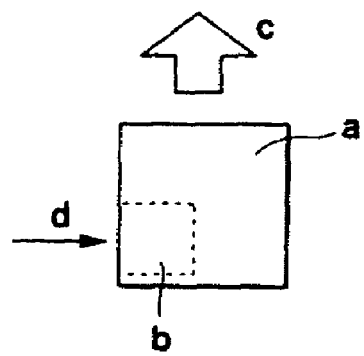
Figure 11D:
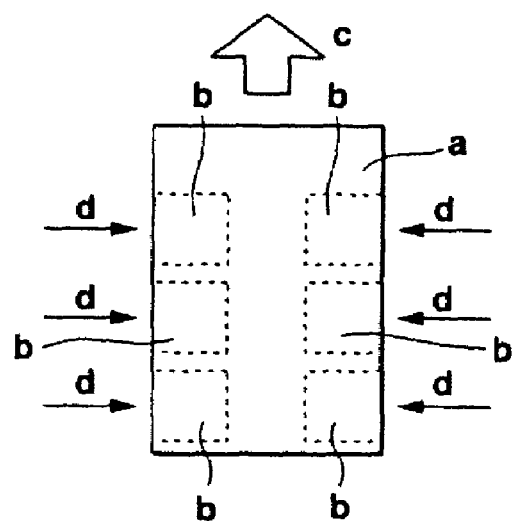

Meanwhile, the present invention is not limited to the so-called memory stick. More specifically, the present invention may be applied to a so-called SD card (a card having a length of a short side approximately 24 mm, a length of a long side approximately 32 mm and a thickness approximately 2.1 mm, as shown in FIG. 11A), a so-called compact flash card (a card having a length of a short side approximately 36.4 mm, a length of a long side approximately 42.8 mm and a thickness approximately 3.3 mm, as shown in FIG. 11B), a so-called smart media (a card having a length of a short side approximately 35 mm, a length of a long side approximately 37 mm and a thickness approximately 0.76 mm, as shown in FIG. 11C), or to a so-called PC card (a card having a length of a short side approximately 54 mm, a length of a long side approximately 85.6 mm and a thickness approximately 3.3 mm or 5.0 mm or 10.5 mm, as shown in FIG. 11D). In FIG. 11A to 11D, "a" represents a card, "b" represents a chip, "c" represents an inserting direction toward a PC, and "d" represents an inserting direction toward the card. This plate-shaped memory device 10 includes a casing 11, made up of an upper half 10a and a lower half 10b, forming the main body unit of the device, as shown in FIGS. 2 to 5. The upper half 10a and the lower half 10b, making up the casing 11, is formed by molding a rigid synthetic resin material. Within the casing 11, formed by bonding together the upper half 10a and the lower half 10b, there is enclosed a semiconductor unit 12 operating as a controller for managing the writing and the readout of information signals. The casing 11 is formed to exhibit mechanical strength such that the casing 11 is not bent with a usual external force that may be applied during use to protect the internal semiconductor unit 12.

On one short side of the casing 11 is formed a terminal unit 13 extending from a front end 11a to a bottom surface 11b. In this terminal unit 13, a number of engagement recesses 15 corresponding to the number of electrodes are formed by being delimited by partitioning walls 14. These engagement recesses 15 are engaged by terminals provided on the host equipment 1. A plural number of the electrodes 16, separated from one another by the partitioning walls 14, are provided on the bottom surfaces of these engagement recesses 15. The electrodes 16, thus provided on the bottom surfaces of the engagement recesses 15, may be protected by the engagement recesses 15 from being directly touched by the user's hand or finger. The present casing 11 is provided with ten electrodes 16. Data exchange with the host equipment 1 is via the electrodes 16 provided in the terminal unit 13 over a serial interface. Specifically, the plural electrodes 16 are at least input terminals for serial protocol bus state signals BS, an input terminal for serial protocol data SDIO and an input terminal of serial clocks SCLK, in addition to a power source voltage VCC terminal and a reserve terminal.

On one corner towards the front end 11a carrying the terminal unit 13 of the casing 11 is formed a chamfered portion 17 for allowing the user to discern the direction of insertion of the casing into the host equipment 1. In a lateral surface of the casing 11 in which is formed the chamfered portion 17, there is formed a mistaken insertion prohibiting groove 18 opened in the bottom surface 11b in continuation to the chamfered portion 17. When loading the memory device 10 in the host equipment 1, the chamfered portion 17 and the mistaken insertion prohibiting groove 18 control the direction of insertion of the memory device 10 into the host equipment 1 to prevent mistaken insertion. That is, if the memory device 10 has not been introduced in a regular condition via insertion/ejection opening 2, the chamfered portion 17 and the mistaken insertion prohibiting groove 18 prevent the electrodes 16 from contacting the set of terminals provided on the host equipment 1.

In one lateral surface 11c the casing 11 towards its one front end 11a is formed a detachment preventative recess 19 opened in the bottom surface 11b. When the casing 11 is inserted into the host equipment 1, the detachment preventative recess 19 is engaged with a resilient engagement piece provided on the host equipment 1 to prevent the detachment of the casing 11 from the host equipment 1. At a mid portion towards the other lateral surface 11d of the casing 11 is formed an engagement recess 21 opened in the bottom surface 11b. The engagement recess 21 is adapted for engaging with an ejection mechanism provided on the host equipment 1.

Figure 6:
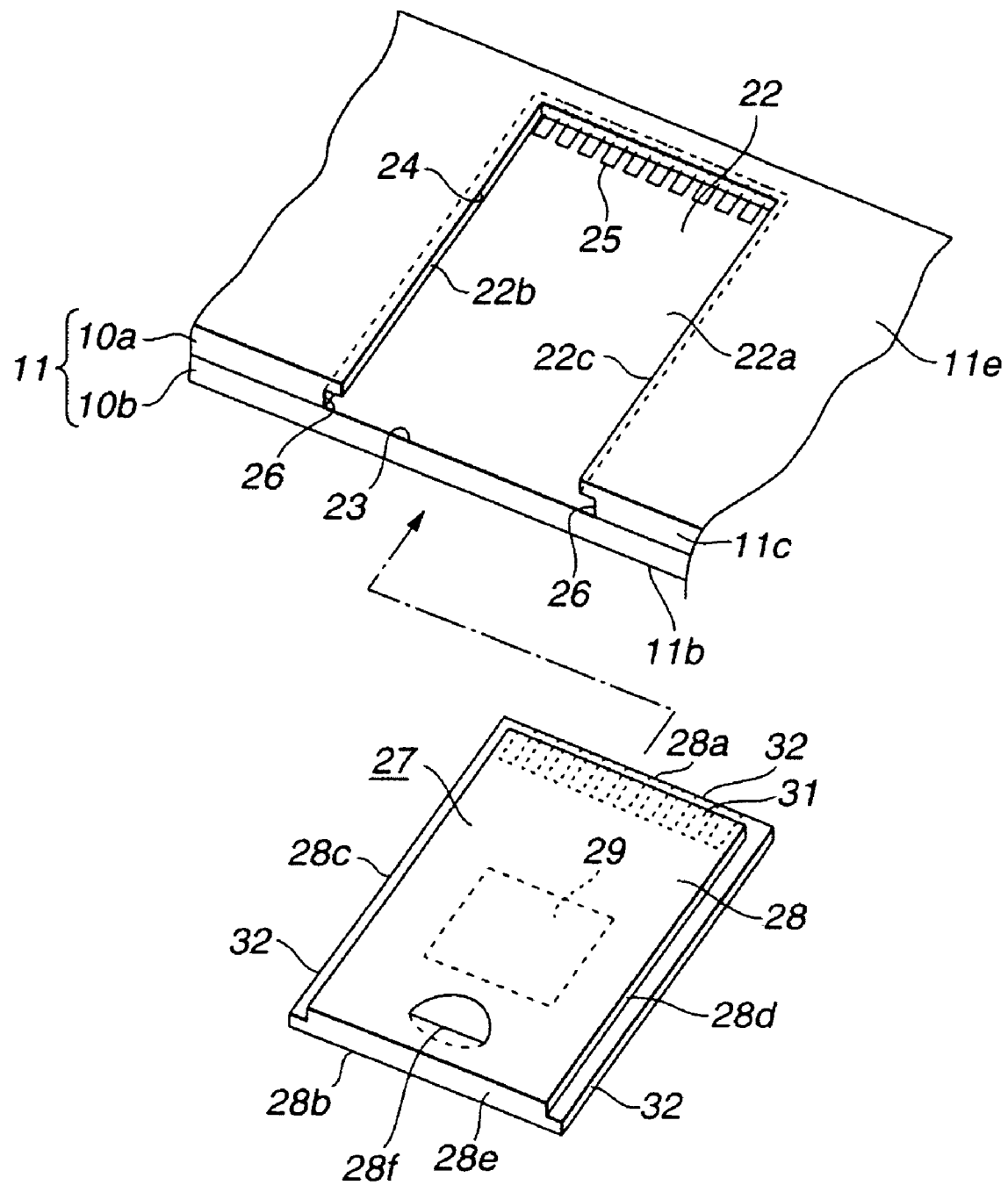
FIG. 6 is a perspective view for illustrating a memory chip that can be mounted on or dismounted from the memory device and a loading unit for loading the memory chip.
Figure 7:
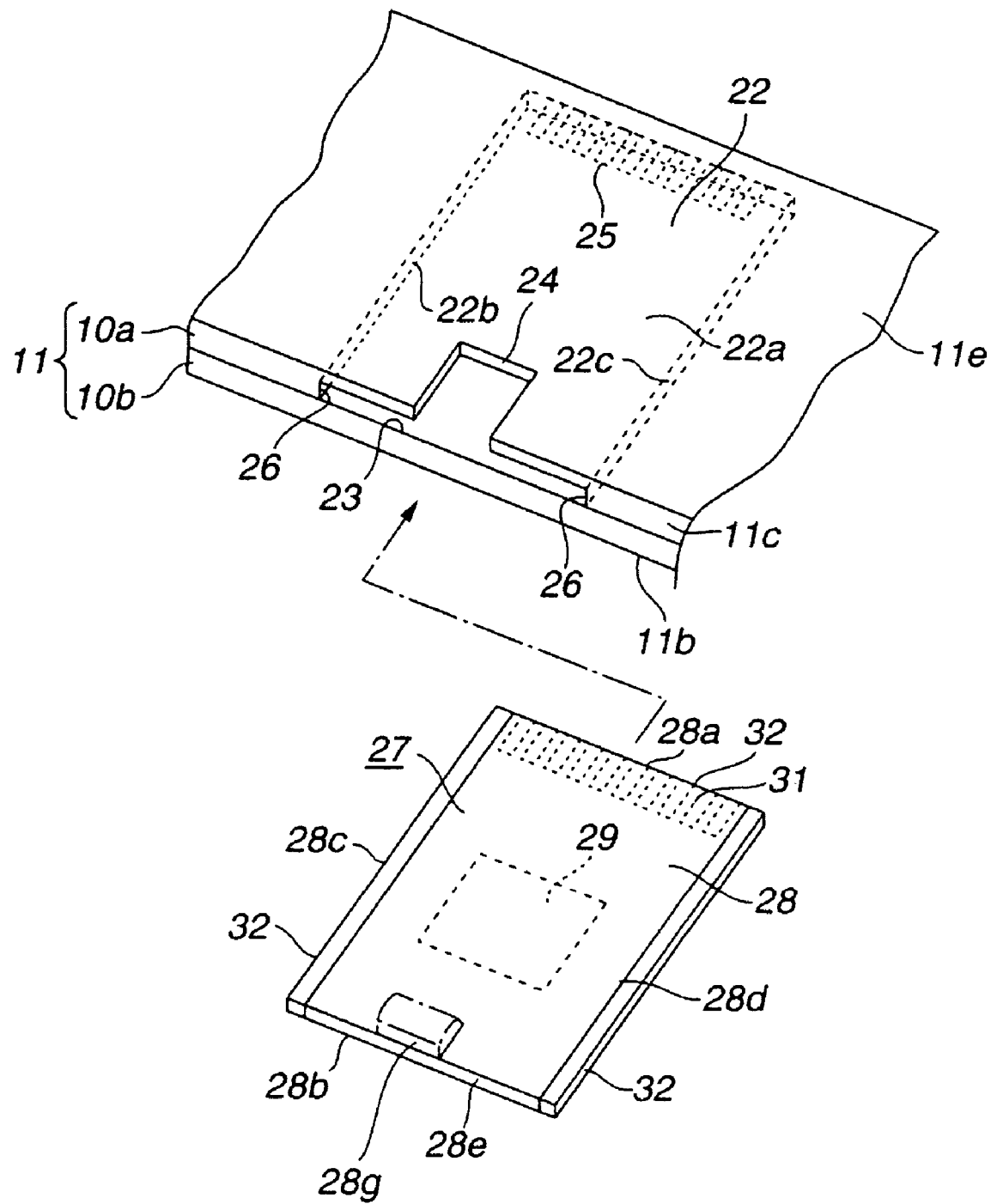
FIG. 7 is a perspective view for illustrating another memory chip that can be mounted on or dismounted from the memory device and a loading unit for loading the memory chip.

Referring to FIGS. 2, 6, and 7, three loading sections 22 are provided side-by-side along the length of the casing 11 for loading or unloading memory chips 27. These loading sections 22 are provided in continuation to insertion/ejection openings 23 formed in one lateral surface 11c of the casing 11. In a planar surface 11e of the casing 11 formed by the upper half 10a is formed an opening 24 through which the memory chips 27 can be inserted or ejected with the user's hand or finger. These loading sections 22 are formed to the same size as the memory chips 27, such that, when the memory chip 27 is loaded in position, the end surface 28e facing outwards via insertion/ejection opening 23 of the memory chip 27 will be flush with the lateral surface 11c of the casing 11. By so doing, the end surface of the memory chip 27 is not protruded from the lateral surface 11c when the memory chip 27 is mounted on the loading section 22, with the result that insertion into or ejection from the host equipment 1 may be performed smoothly with optimum hand feel.

The bottom surface 22a of the loading section 22 also operates as an insertion or ejection guide in inserting or ejecting the memory chip 27. In the innermost part of the loading section 22, there are provided connection terminals 25 for establishing electrical connection with respect to the memory chip 27. In the lateral surface 22b in the loading section 22, parallel to the insertion direction of the memory chip 27, and in the lateral surface 22c thereof against which abuts the insertion end of the memory chip 27, there are formed guide recesses 26 for guiding the insertion or ejection of the memory chip 27 and for controlling its loading position.

The memory chip 27, mounted on the loading section 22, includes a substantially rectangular main body unit 28 of substantially the same size as the loading section 22, molded of the same material as the casing 11, as shown in FIGS. 6 and 7. Within the main body unit 28 of the chip are disposed one or more flash memories 29 as semiconductor memories. Each flash memory 29 has a storage capacity of, for example, 4 MB, 8 MB, 32 MB, 64 MB, 128 MB, . . . . On the bottom surface 28b towards the insertion end of the main body unit 28 of the chip, that is, towards its front end 28a, there are provided a plural number of terminals 31 electrically connected to the connection terminals 25 provided on the loading section 22. By these terminals 31 being electrically connected to the connection terminals 25 of the loading section 22, data can be written on or read out from the flash memory 29 by a control circuit provided in the semiconductor unit 12 provided on the casing 11.

On a portion of the bottom surface 28b towards the front end 28a of the main body unit 28 of the chip and towards both lateral surfaces 28c, 28d neighboring to the front end 28a is protuberantly formed a guide section 32 adapted for guiding the insertion of the main body unit 28 of the chip into the loading section 22. This guide section 32 is engaged in the guide recesses 26 formed in the loading section 22 to guide the insertion or ejection of the memory chip 27.

In order to prevent detachment of the memory chip 27 from the loading section 22, a detachment preventative member may be provided in the vicinity of the insertion/ejection openings 23. The number of the loading sections 22 may be one, two or not less than four instead of three.

On the upper surface of the main body unit 28 of the chip, a cut-out 28f for a pawl, shown in FIG. 6, or a notch 28g, shown in FIG. 7, may also be provided, to assure facilitated insertion into or ejection from the casing 11 of the main body unit 28 of the chip.

The circuit structure of the memory device 10 and the host equipment 1 on which the memory device 10 is mounted is now explained with reference to FIG. 8.

First, the circuit structure of the memory device 10 is explained. A controller 41, provided in the semiconductor unit 12 in the casing 11 of the memory device 10, includes a memory controller 42 for controlling data writing to or read-out from the flash memory 29 of the memory chip 27, a register 43 having a variety of parameters for data writing or readout, a page buffer 44 for transient data storage and a serial/parallel/serial interface (S/P•P/S interface) 45 for data exchange with the host equipment 1. The casing 11, forming the main body unit of the memory device 10, includes a chip interface 46 for data exchange between the flash memory 29 of the memory chip 27 and the controller 41 of the casing 11. The chip interface 46 enables data exchange between the controller 41 and a chip having a variety of functions when the chip is mounted on the loading section 22.

The memory chip 27, mounted on or dismounted from the casing 11, includes a sole flash memory 29 and a chip interface 47 connected to the chip interface 46 to effect data exchange with the controller 41.

By way of explaining the circuit structure of the host equipment 1, the host equipment 1 includes a file manager 51 performing file management of the memory device 10, a transfer protocol interface 52 for executing access to the register 43 or to the page buffer 44 of the controller 41 of the memory device 10, and a serial interface 53 providing for the protocol necessary for data transfer over three signal lines, namely, the serial clock SCLK, the bus state BS and the serial data input/output SDIO. The file manager 51 is realized by a controller, such as a CPU, of the host equipment 1 executing the application.

By way of explaining the method of using the memory device 10, the memory chip 27 is inserted into the casing 11 via the insertion/ejection openings 23 provided in the lateral surface 11c of the casing 11, with the front end 28a carrying the terminal 31 as the insertion end, as shown in FIGS. 6 and 7. At this time, the memory chip 27 is inserted into the loading section 22 via insertion/ejection openings 23 as the guide section 32 is engaged with the guide recesses 26 formed in the loading section 22. Thus, the user is able to insert the memory chip 27 smoothly into the loading section 22. When the insertion of the memory chip 27 comes to a close, the chip interface 47 on the memory chip 27 shown in FIG. 8 is connected to the chip interface 46 on the casing 11.

When the loading of the memory chip 27 in the loading section 22 comes to a close, the back end 28e of the main body unit 28 of the chip is substantially flush with the lateral surface 11c of the casing 11 provided with the insertion/ejection openings 23. Thus, the memory device 10 is able to insert the memory chip 27 smoothly into the host equipment 1. Moreover, the user may be safeguarded from having an objectionable feeling when holding the memory device 10 with his or her hand.

It is unnecessary to have memory chips 27 mounted in all of the loading sections 22 provided in the casing 11, but only one or two memory chips 27 may suffice. Moreover, not only memory chips 27 of the same storage capacity, but also those having different storage capacities may be loaded. Therefore, the user is able to set the overall storage capacity of the memory device 10 depending on the objects of use. Moreover, the user is able to load such memory chips 27 having stored therein data classified depending on data sorts, such as by loading a memory chip having musical numbers stored therein, a memory chip having picture data stored therein and a memory chip having data for processing by a computer stored therein, or by loading a memory chip having stored therein data in need of copyright management and a memory chip having stored therein data not in need of copyright management. This enables the user to perform data management extremely easily.

The memory chip 27 can be taken from the casing 11 easily by sliding the memory chip 27, facing outwards via opening 24, towards the insertion/ejection openings 23.

The memory device 10, having a memory chip 27 loaded in at least one of the loading sections 22, is inserted via insertion/ejection opening 2 of the host equipment 1, with the front end 11a carrying the terminal unit 13 of the casing 11 as an insertion end, as shown in FIG. 1. It is noted that the chamfered portion 17 and the mistaken insertion prohibiting groove 18 are provided in the front end 11a of the casing 11. Thus, if the memory device 10 is inserted via insertion/ejection opening 2 of the host equipment 1 under a non-usual condition, for example, in the upside-down condition, the memory device 10 cannot be inserted, thus prohibiting the mistaken insertion. If the memory device 10 is inserted into the loading section of the host equipment 1, the detachment preventative recess 19 formed in the memory device 10 is engaged by e.g., an elastic engagement portion provided on the loading section of the host equipment 1 to provide for positive mounting on the loading section to prevent inadvertent detachment.

Figure 8:
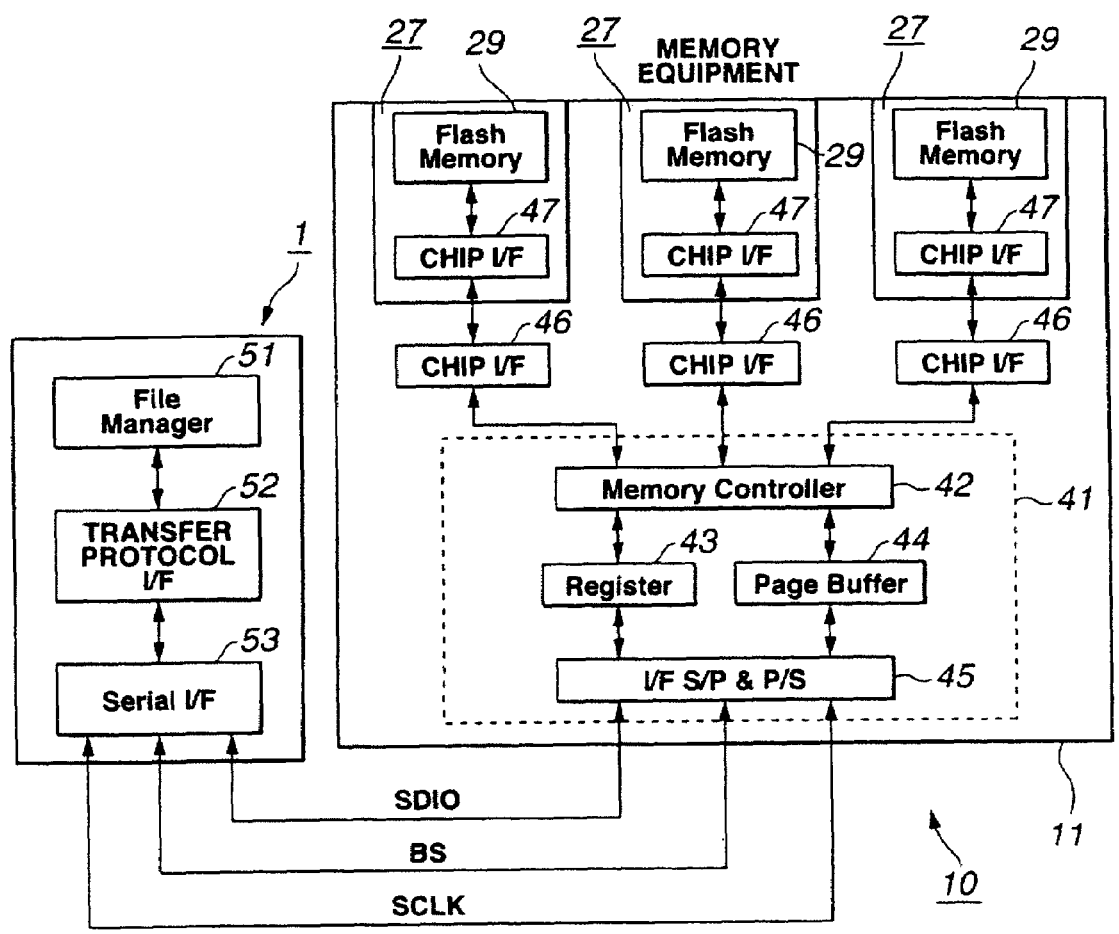
FIG. 8 is a block diagram for illustrating a circuit structure of the memory device and the host equipment.

When the memory device 10 is loaded in the host equipment 1, the electrodes 16 are caused to contact the set of terminals provided on the host equipment 1 so that the S/P•P/S interface 45 on the side of memory device 10 is connected to a serial interface 53 on the host equipment 1, as shown in FIG. 8. The S/P•P/S interface 45 then is fed from the host equipment 1 with the serial protocol bus state signals BS and serial clocks SCLK. The controller supervising the entire host equipment 1 executes the application to realize the file manager 51 which then reads out the data information, such as filename or data size, from the flash memory 29 of the memory chip 27 loaded in the loading section 22 of the casing 11.

When writing data in the flash memory 29 of the memory chip 27, the file manager 51 updates itself at the same time as it outputs data to the memory device 10 through a transfer protocol interface 52 and the serial interface 53. Based on control signals from the file manager 51, the memory controller 42 causes data input from the host equipment 1 to be transiently stored in a page buffer 44 through S/P•P/S interface 45 in accordance with the serial protocol bus state signals BS and the serial clocks SCLK. The memory controller 42 then causes data to be stored, through the chip interfaces 46, 47, in the flash memory 29 of the memory chip 27 mounted in the loading section 22 of a preset address.

When reading out data stored in the flash memory 29 of the memory chip 27 of a preset address, the memory controller 42 reads out data to the page buffer 44 from the flash memory 29 of the preset memory chip 27 in accordance with the serial protocol bus state signals BS and the serial clocks SCLK, to output the read-out data to the host equipment 1 through the S/P•P/S interface 45. The file manager 51 reads out data through the serial interface 53 and the transfer protocol interface 52.

Meanwhile, the memory device 10, loaded in the loading section of the host equipment 1, is ejected to the outside via insertion/ejection opening 2 by an ejection mechanism engaged in the engagement recess 21 formed in the casing 11.

The memory chip 27 may be used by itself as an external storage device for the host equipment 1. At this time, the casing 11 forming the main body unit of the memory device 10 operates as an adapter device in reading out or writing data by a host equipment incapable of directly mounting the memory chip 27.

With the above-described memory device 10, the overall storage capacity may be set solely by exchanging the memory chip 27. The user is able to change the entire storage capacity depending on the use object to improve convenience in use. The user is also able to put the memory device 10 to different uses from one loading section 22 to another. For example, the memory chip 27 mounted on the first loading section 22 may be used to store music, while the memory chip 27 mounted on the second loading section 22 may be used to store picture data, and the memory chip 27 mounted on the third loading section 22 may be used to store processing data to be processed by a computer. So, the user may easily supervise the data. Moreover, if a further memory is required, the user only has to purchase the memory chip 27 so that the user may be relieved of excess expenses.

Meanwhile, an integrated circuit unit having a built-in logic circuit may be enclosed as an integrated circuit unit in the main body unit 28 of the chip in addition to the aforementioned flash memory 29.

Figure 9:
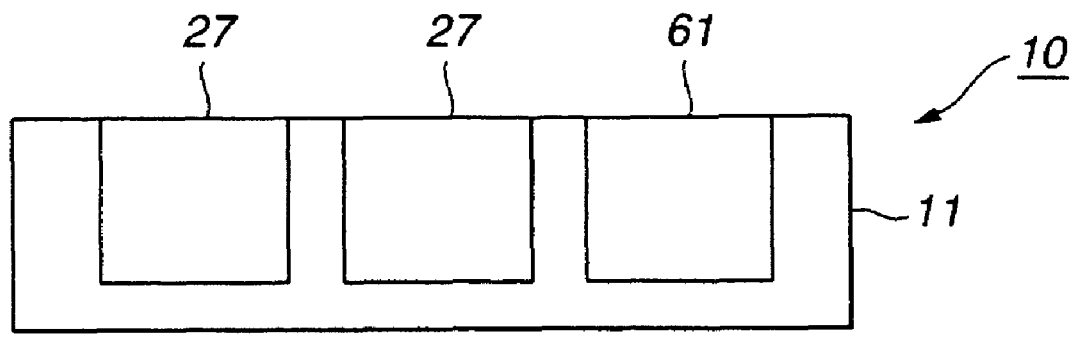
FIG. 9 illustrates an instance of loading a memory chip and a copyright protection chip on a loading unit provided on a casing.

For example, in the embodiment shown in FIG. 9, the memory chip 27 is mounted in each of the address 1 loading section 22 and address 2 loading section 22, while a copyright protection chip 61 is mounted in the address 3 loading section 22. If memory chips 27 are mounted in each of the address 1 loading section 22 and address 2 loading section 22, and digital contents such as music data or picture data of digital signals protected by copyright are saved in these memory chips 27, it is necessary to protect e.g., the ID of the user in order to prevent illicit copying of the digital contents saved in these memory chips 27. Thus, in the present memory device, the user ID, for example, is stored in an address 3 in the main body unit 28 of the chip in the present memory device, while the copyright protection chip 61 having a built-in integrated circuit chip having a logic circuit capable of authentication mounted therein is mounted in the address 3 loading section 22. This gives a memory device having the function of protecting the copyrights.

Figure 10:
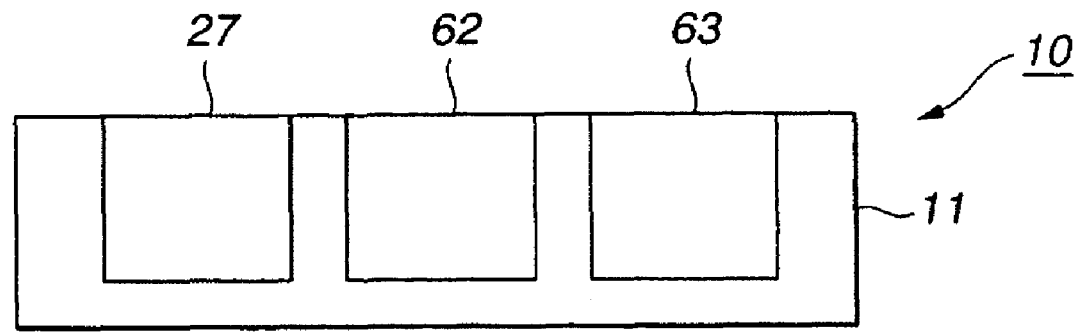
FIG. 10 illustrates an instance of loading a memory chip, a transmission/reception circuit chip and an antenna chip.

In the embodiment shown in FIG. 10, the memory chip 27 is loaded on the address 1 loading section 22, the transmission/reception circuit chip 62 is mounted on the address 2 loading section 22, and an antenna chip 63 is loaded on the address 3 loading section 22. This guarantees data transmission/reception between different memory devices.

Of course, there is no particular limitation to the addresses of the loading sections 22 mounting these chips 27, 61, 62 or 63.

With the memory device according to the present invention, as described above, since integrated circuit chips having a variety of functions may be loaded on the loading section 22 of the casing 11, a variety of functions may be annexed to the memory function with the use of the sole casing 11.

According to the present invention, integrated circuit chips other than the memory chip 27 may be mounted on all of plural loading sections 22 provided on the casing 11 as an adapter device. The integrated circuit chips, other than the memory chip 27, mounted on the casing 11 as an adapter device, operate as a function expanding device for the host equipment.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An integrated circuit chip adapted to be loaded in an adaptor device for use in host equipment, said integrated circuit chip comprising:
    a main body unit removably insertable into the adaptor device and having a pair of sidewalls;
    an integrated circuit unit disposed in said main body unit, said integrated circuit unit comprising a copyright protection circuit unit;
    a set of terminals provided at one end of said main body unit for establishing an electrical connection enabling information signals to be exchanged between said integrated circuit unit and the adaptor device; and
    a guide support unit including a pair of protuberantly formed guide sections provided on said pair of sidewalls of said main body unit for guiding the insertion of said main body unit into a pair of guide recesses disposed along sidewalls of the adaptor device;
    wherein, when said integrated circuit chip is loaded in the adaptor device along with a separate memory device, said copyright protection circuit unit is operable to authenticate the separate memory device to protect copyrighted data stored on the separate memory device.

2. The integrated circuit chip of claim 1, wherein said copyright protection circuit unit includes a built-in logic circuit for authenticating a user ID of the separate memory device.

3. An integrated circuit device adapted to be loaded in host equipment, comprising:
    a main body unit;
    a first set of connection terminals provided at one end of said main body unit to enable electrical connection between said main body unit and the host equipment;
    a plurality of loading sections provided in said main body unit, each of said loading sections having an insertion opening along an edge of said main body unit transverse to said one end, a second set of connection terminals spaced from said insertion opening, and a pair of sidewalls disposed between said insertion opening and said second set of connection terminals;
    a plurality of integrated circuit chips assembled in respective ones of said loading sections, each of said integrated circuit chips including a built-in integrated circuit unit forming a memory unit or a logic circuit and a third set of connection terminals for establishing electrical connection between said second set of connection terminals in said loading section and said integrated circuit unit, and said logic circuit of one of said integrated circuit chips comprises a copyright protection circuit unit that is operable to authenticate said memory unit of another one of said integrated circuit chips to protect copyrighted data stored on said memory unit of. said another integrated circuit chip;
    a guide support provided in each of said loading sections and extending in a direction transverse to said insertion opening for guiding the insertion of said integrated circuit chips into said loading section, each said guide support including a pair of guide recesses formed along said pair of sidewalls of said loading section; and
    a controller disposed in said main body unit for controlling the writing of information signals to and the readout of information signals from said plurality of integrated circuit chips loaded in said loading sections, said controller including:
    a memory controller for concurrently controlling data writing and reading to each of said integrated circuit chips assembled in said respective ones of said loading sections;
    an interface for enabling data exchange between said controller and the host equipment;
    a register logically associated with said memory controller and said interface and having a variety of parameters for data exchange; and
    a buffer logically associated with said memory controller and said interface for transient data storage.

4. The integrated circuit device of claim 3, wherein said copyright protection circuit unit authenticates a user ID associated with said memory unit of said another integrated circuit chip.

5. A memory device adapted to be loaded in host equipment, comprising:
    a main body unit;
    a first set of connection terminals provided at one end of said main body unit to enable electrical connection between said main body unit and the host equipment;
    a plurality of loading sections provided in said main body unit, each of said loading sections having an insertion opening along an edge of said main body unit transverse to said one end, a second set of connection terminals spaced from said insertion opening, and a pair of sidewalls disposed between said insertion opening and said second set of connection terminals;

a plurality of memory chips assembled in respective ones of said loading sections, each of said memory chips including a memory unit therein and a third set of connection terminals for establishing electrical connection between said second set of connection terminals in said loading section and said memory unit;

a copyright protection circuit chip assembled in one of said loading sections that is operable to authenticate said memory unit of at least one of said memory chips to protect copyrighted data stored therein;

a guide support provided in each of said loading sections and extending in a direction transverse to said insertion opening for guiding the insertion of said memory chips into said loading section, each said guide support including a pair of guide recesses formed along said pair of sidewalls of said loading section; and a controller disposed in said main body unit for controlling the writing of information signals to and the readout of information signals from said plurality of memory chips loaded in said loading sections, said controller including:
  a memory controller for concurrently controlling data writing and reading to each of said integrated circuit chips assembled in said respective ones of said loading sections;
  an interface for enabling data exchange between said controller and the host equipment;
  a register logically associated with said memory controller and said interface and having a variety of parameters for data exchange; and
  a buffer logically associated with said memory controller and said interface for transient data storage.

6. The memory device according to claim 5, wherein said memory unit is a flash memory.

7. The memory device of claim 5, wherein said copyright protection circuit chip authenticates said memory unit based on a user ID associated with said memory unit.

8. An adapter device adapted to be loaded in host equipment, comprising:

a main body unit;

a first set of connection terminals provided at one end of said main body unit to enable electrical connection between said main body unit and the host equipment;

a plurality of loading sections provided in said main body unit, each of said loading sections having an insertion opening along an edge of said main body unit transverse to said one end, a second set of connection terminals spaced from said insertion opening, and a pair of sidewalls disposed between said insertion opening and said second set of connection terminals;

a plurality of integrated circuit chips or dummy chips assembled in respective ones of said loading sections, each of said integrated circuit chips including a built-in integrated circuit unit forming a memory unit or a logic circuit in electrical connection with said second set of connection terminals in said loading section, each of said dummy chips being of substantially the same shape as said integrated circuit chips, and said logic circuit of one of said integrated circuit chips comprises a copyright protection circuit unit that is operable to authenticate said memory unit of another one of said integrated circuit chips to protect copyrighted data stored on said memory unit of said another integrated circuit chip;

a guide support provided in each of said loading sections and extending in a direction transverse to said insertion opening for guiding the insertion of said integrated circuit chips or said dummy chips into said loading section, each said guide support including a pair of guide recesses formed along said pair of sidewalls of said loading section; and a controller disposed in said main body unit for controlling said integrated circuit chips loaded in said loading sections, said controller including:
  a memory controller for concurrently controlling data writing and reading to each of said integrated circuit chips assembled in said respective ones of said loading sections;
  an interface for enabling data exchange between said controller and the host equipment;
  a register logically associated with said memory controller and said interface and having a variety of parameters for data exchange; and
  a buffer logically associated with said memory controller and said interface for transient data storage.

9. The adapter device of claim 8, wherein said copyright protection circuit unit authenticates a user ID associated with said memory unit of said another integrated circuit chip.

* * * * *